US 8,077,938 B2

(12) United States Patent
McGraw

(10) Patent No.: US 8,077,938 B2
(45) Date of Patent: Dec. 13, 2011

(54) DIFFUSION TENSOR SURFACE VISUALIZATION

(75) Inventor: Tim McGraw, Gainesville, FL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 1016 days.

(21) Appl. No.: 11/347,039

(22) Filed: Feb. 3, 2006

(65) Prior Publication Data

US 2006/0176488 A1 Aug. 10, 2006

Related U.S. Application Data

(60) Provisional application No. 60/651,155, filed on Feb. 9, 2005.

(51) Int. Cl.
*G06K 9/00* (2006.01)

(52) U.S. Cl. ........ 382/128; 382/100; 382/131; 600/410; 345/419; 345/420; 345/421; 850/46; 850/47

(58) Field of Classification Search .................. 382/100, 382/128, 131; 600/410; 345/419–421; 850/45, 850/47
See application file for complete search history.

(56) References Cited

U.S. PATENT DOCUMENTS

| 5,625,660 | A * | 4/1997 | Tuy .................................. 378/15 |
| 6,526,305 | B1 * | 2/2003 | Mori ............................. 600/410 |
| 6,591,004 | B1 * | 7/2003 | VanEssen et al. ............. 382/154 |
| 6,642,716 | B1 * | 11/2003 | Hoogenraad et al. ......... 324/309 |
| 7,034,531 | B1 * | 4/2006 | Tuch et al. .................... 324/309 |
| 2003/0214289 | A1 * | 11/2003 | van Muiswinkel et al. .. 324/307 |
| 2003/0234781 | A1 * | 12/2003 | Laidlaw et al. ............... 345/419 |

OTHER PUBLICATIONS

Kindlmann, G.; Weinstein, D.; Hart, D.; Strategies for direct volume rendering of diffusion tensor fields. Visualization and Computer Graphics, IEEE Transactions on vol. 6, Issue 2, Apr.-Jun. 2000 pp. 124-138.*

McGraw, T.; Neuronal Fiber Tracking in DT-MRF', University of Florida, Thesis, 2002, pp. 1-69.*

Sato, T.; Minato, K.; Sadato, N.; Okada, T.; Yonekura, Y.; Kabasawa, H.; Quantitative analysis for the connectivity of nerve bundles using MR DTI. Engineering in Medicine and Biology Society, 2000. Proceedings of the 22nd Annual International Conference of the IEEE vol. 3, Jul. 23-28, 2000 pp. 2358-2360.*

Clarenz, U.; Diewald, U.; Rumpf, M.; Processing textured surfaces via anisotropic geometric diffusion. Image Processing, IEEE Transactions on vol. 13, Issue 2, Feb. 2004 pp. 248-261.*

Brian Cabral et al. "Imaging Vector Fields Using Line Integral Convolution" *Computer Graphics Proceedings*, pp. 263-270, Mar. 1993.
Tim E. McGraw, Thesis, "Neuronal Fiber Tracking in DT-MRI", pp. 1-69, University of Florida, 2002.

* cited by examiner

*Primary Examiner* — Vikkram Bali
*Assistant Examiner* — Julian Brooks
(74) *Attorney, Agent, or Firm* — Donald B. Paschburg; F. Chau & Associates, LLC

(57) ABSTRACT

A computer implemented method for diffusion tensor visualization includes receiving diffusion weighted image slice data, segmenting a diffusion tensor field from the diffusion weighted image slice data to determine a three-dimensional triangular mesh, and determining a fractional anisotropy field and a principle diffusion direction field of the diffusion tensor field. The method includes determining a streamline through each surface point on a segmented surface of the diffusion tensor field according to the principle diffusion direction field, determining an oriented texture intensity for the surface points from corresponding streamlines, determining a surface color for the surface points by combining the oriented texture intensity, a color determined from the principle diffusion direction field, and a value of fractional anisotropy field at the surface points, and visualizing the surface points by rendering the surface points having the corresponding surface colors.

14 Claims, 3 Drawing Sheets

DIFFUSION TENSOR SURFACE VISUALIZATION

This application claims priority to U.S. Provisional Application Ser. No. 60/651,155, filed on Feb. 9, 2005, which is herein incorporated by reference in its entirety.

BACKGROUND OF THE INVENTION

1. Technical Field

The present invention relates to image processing, and more particularly to a system and method for diffusion tensor MRI surface visualization.

2. Discussion of Related Art

Diffusion tensor (DT) image scans comprise at least six gradient directions, sufficient to determined a diffusion tensor in a brain. From the diffusion tensor, diffusion anisotropy measures such as the Fractional Anisotropy (FA) can be determined. Moreover, the principal direction of the diffusion tensor can be used to infer white-matter connectivity of the brain as a tract.

A visualization strategy for such a tract is to render a diffusion ellipsoid at a subset of data points. Since a three-dimensional field of ellipsoids would occlude each other, this visualization is typically done for two-dimensional slices of data. Additionally, only ellipsoids on a sparse grid can be rendered in order for each ellipsoid to be discerned. This type of visualization can become visually cluttered and convey so little information as to be substantially useless.

Previous work for visualization has included a texture base approach, generating an image by blurring a source image in the direction of the vector field at each point. Line integral convolution (LIC) is one technique for implementing this visualization. Another approach with substantially similar visual results uses the solution of a partial differential equation (PDE).

Rendering techniques used for texture-based DT-MRI visualization include planar surface rendering and volume rendering. In planar surface rendering, the image is determined for a planar slice of the DT-MRI data, and displayed as a textured quadrilateral (see FIG. 1). The volume rendering technique includes determining the texture at each point in the volume and rendering the field by ray-casting, or some similar technique. These techniques can be computationally expensive.

Therefore, a need exists for visualizing large-scale anatomical information.

SUMMARY OF THE INVENTION

According to an embodiment of the present disclosure, a computer implemented method for diffusion tensor visualization includes receiving diffusion weighted image slice data, segmenting a diffusion tensor field from the diffusion weighted image slice data to determine a three-dimensional triangular mesh, and determining a fractional anisotropy field and a principle diffusion direction field of the diffusion tensor field. The method includes determining a streamline through each surface point on a segmented surface of the diffusion tensor field according to the principle diffusion direction field, determining an oriented texture intensity for the surface points from corresponding streamlines, determining a surface color for is the surface points by combining the oriented texture intensity, a color determined from the principle diffusion direction field, and a value of fractional anisotropy field at the surface points, and visualizing the surface points by rendering the surface points having the corresponding surface colors.

According to an embodiment of the present disclosure, a program storage device is provided readable by machine, tangibly embodying a program of instructions executable by the machine to perform method steps for diffusion tensor visualization. The method includes receiving diffusion weighted image slice data, segmenting a diffusion tensor field from the diffusion weighted image slice data to determine a three-dimensional triangular mesh, and determining a fractional anisotropy field and a principle diffusion direction field of the diffusion tensor field. The method includes determining a streamline through each surface point on a segmented surface of the diffusion tensor field according to the principle diffusion direction field, determining an oriented texture intensity for the surface points from corresponding streamlines, determining a surface color for the surface points by combining the oriented texture intensity, a color determined from the principle diffusion direction field, and a value of fractional anisotropy field at the surface points, and visualizing the surface points by rendering the surface points having the corresponding surface colors.

According to an embodiment of the present disclosure, a computer implemented method for diffusion tensor visualization includes receiving diffusion weighted image slice data, segmenting a diffusion tensor field from the diffusion weighted image slice data to determine a three-dimensional triangular mesh, and determining a fractional anisotropy field and a principle diffusion direction field of the diffusion tensor field. The method includes determining a streamline through each surface point on a segmented surface of the diffusion tensor field according to the principle diffusion direction field, determining an oriented texture intensity for the surface points from corresponding streamlines, determining a surface color for the surface points by combining at least two of the oriented texture intensity, a color determined from the principle diffusion direction field, and a value of fractional anisotropy field at the surface points, and visualizing the surface points by rendering the surface points having the corresponding surface colors.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

According to an embodiment of the present disclosure, a method includes visualizing a DT image of large-scale anatomical information and voxel-wise tensor information. The voxel-wise tensor information can include anisotropy or directionally dependent information and principal diffusion direction information.

DT Magnetic Resonance Imaging (DT-MRI) is a method of measuring the rate of water diffusion in biological structures. A DT at each location on a regular lattice describes a volumetric average of the directional properties of water diffusion within each voxel using a symmetric, positive-definite matrix, e.g., a 3×3 matrix. Through the observation that the diffusion is anisotropic in areas of white-matter fiber bundles, the DT-MRI enables the inference of white-matter fiber direction from the determined tensor field. These fiber tracts can be visualized in three-dimensions as streamlines or streamtubes.

Streamtubes are a three-dimensional analogue to streamlines. The streamtube is determined by using a streamline as a centerline of the tube. The streamtube diameter is used to encode additional information about the tensor field being visualized, such as a fractional anisotropy (FA) value.

Figure 2:
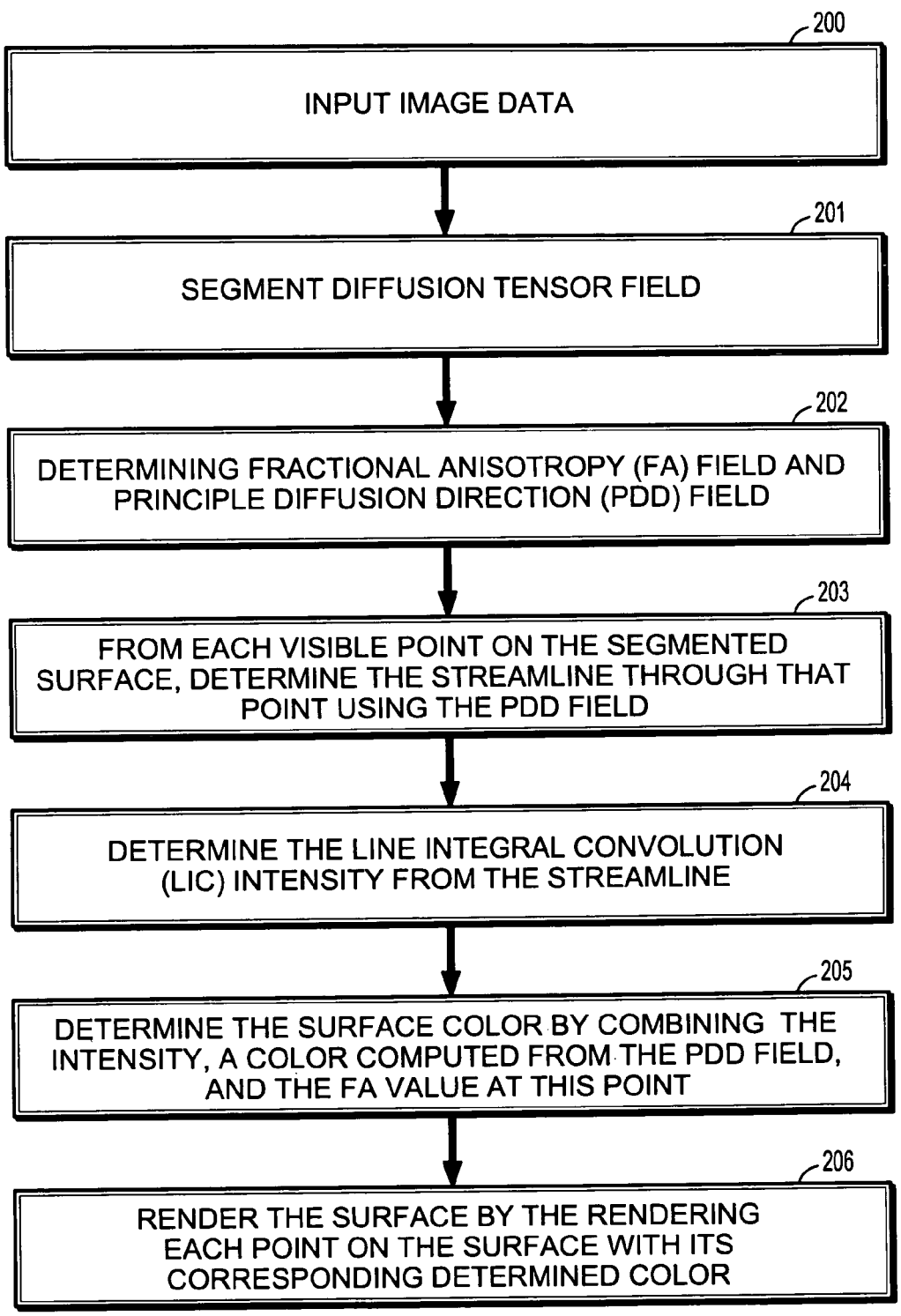
FIG. 2 is a flow chart of a method according to an embodiment of the present disclosure.

Referring to FIG. 2, the method includes segmenting the DT field 201 from input image data 200, determining the FA field and a principle diffusion direction (PDD) field 202. The method includes determining a streamline through each point on the segmented surface, e.g., each point that would be visible if visualized, according to the PDD field 203. The method further includes determining a line integral convolution (LIC) intensity from the streamline 204, determining a surface color of each surface point by combining the LIC intensity, a color determining from the PDD field, and the FA value at this point 205, and rendering the surface by rendering each point on the surface with its corresponding determined color 206.

The input image data 200 may be diffusion weighted MRI image slices or CT image slices registered to a tensor field. Herein, exemplary embodiments of the present disclosure are presented in conjunction with MRI image slices.

Referring to block 201, the DT field captured in a DT-MRI is segmented using a geodesic active contour yielding a three dimensional triangular mesh. Other methods of segmentation include, for example, fiber tracking methods, direct thresholding based on the PDD, scalar measures of diffusion, etc.

An example of segmentation of the DT field includes converting the tensors into an eigenvalue/eigenvector representation, which is rotationally invariant. Converted tensors can be interpreted as an ellipsoid with principal axes oriented along the eigenvectors and radii equal to the corresponding eignenvalues. The ellipsoid describes the probabilistic distribution of a water molecule after a fixed diffusion time. Using the eigenvalues/eigenvectors anisotropy measures can be determined, including the FA.

Referring to block 202, the FA field is determined. The FA field is a grey scale image, for example, see 302 in FIG. 3, which shades white matter differently from grey matter and ventricles in a brain or spinal column scan. The FA is a measure of the fraction of the magnitude of the DT that can be ascribed to the anisotropic diffusion. Once the DT has been estimated (see block 201), the PPD can be determined by finding the eigenvector corresponding to the dominant eigenvalue of a current tensor. The fiber tracts may be mapped by visualizing the streamlines through the field of eigenvectors. Mapping includes encoding the PPD by an RGB color scheme, wherein, for example, fiber tracts along the anterior posterior direction are encoded using green color, fiber tracts running left to right are encoded with red color and fibers perpendicular to the image plane are encoded by blue color.

A streamline is determined for the points on the segmented surface of the triangular mesh 203. The streamlines follow the orientation of the principal eigenvector of the DT at each point.

Referring to block 204, a three-dimensional vector field corresponding to the dominant eigenvalues of the diffusion tensor is visualized by the LIC as a texture-based vector. The LIC generates intensity grey scale values by convolving a noise texture with a curvilinear kernel aligned with the streamline through each pixel (e.g., the streamline is determined within the kernel).

The three-dimensional vector field corresponding to the dominant eigenvalues of the diffusion tensor can be visualized using the LIC technique. The LIC technique visualizes local vector field tangents.

According to the LIC, intensity values are generated by convolving the noise texture with the curvilinear kernel aligned with the streamline through each pixel, such as by $$I(x_0) = \int_{s_0-L}^{s_0+L} T(\sigma(s))k(s_0 - s)ds$$

where $I(x_0)$ us the intensity of the LIC texture at pixel $x_0$. k is a filter kernel of width 2L. T is the input noise texture, and $\sigma$ is the streamline through point $x_0$. The streamline $\sigma$ can be found by numerical integration given the discrete field of eigenvectors.

The LIC result is a grey scale texture with highly correlated values between nearby pixels on the same streamline and contrasting values for pixels not sharing the streamline. For example, an FA value below a certain threshold can be a stopping criterion for the integration since the diffusion field ceases to have a principal direction for low FA values.

Since the fiber direction is parallel to the dominant eignenvector of the diffusion tensor, fiber paths can be determined as integral curves of the dominant eignevector field. The stopping criterion is based on FA value. For example, when FA falls below about 0.17 the diffusion is considered to be nearly isotropic and the fiber is no longer tracked.

Referring to block 205 the surface color is determined by a combination of two or more of the LIC grey scale intensity, the color determining from the PDD field, and the FA grey scale value at each point or pixel such that the vector filed of the visible points (e.g., surface) of the DT is colored according to the PDD. The combination of the LIC, the FA and the PDD can be by multiplication, e.g., multiplying the RGB values of the PDD, the grey value of the LIC and the grey value of the FA to get a modified color value for surface rendering including information about the LIC and FA. The combination can be limited to the PPD and the LIC or the PDD and the FA.

The surface points are rendered in color 206 and may be output to a display or storage media.

Figure 1:
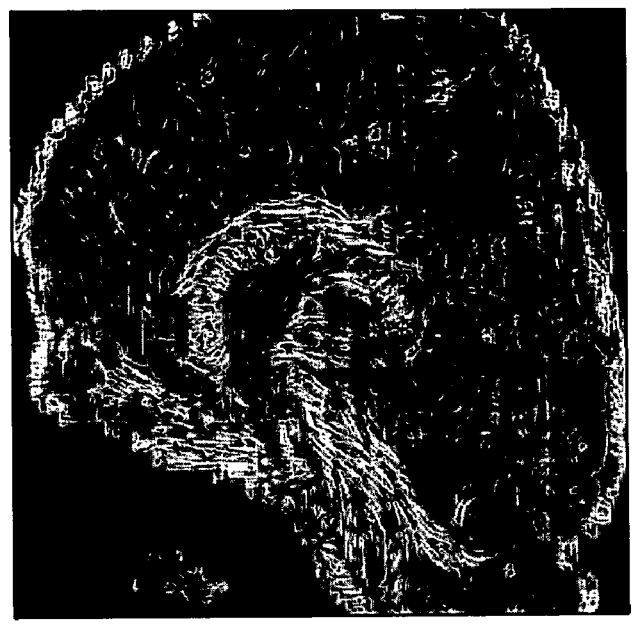
FIG. 1 is an exemplary planar LIC according to an embodiment of the present disclosure.
Figure 3:
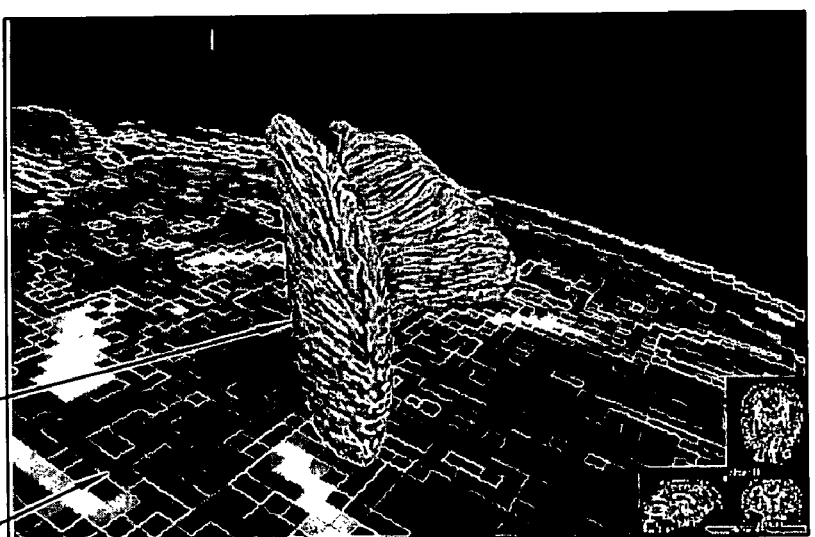
FIG. 3 is an exemplary surface visualization according to an embodiment of the present disclosure.

According to an embodiment of the present disclosure, a method for DT visualization (see for example, FIG. 3) restricts determinations and visualization to a surface of interest, anatomical or otherwise. Both the LIC and the PDE approaches can be solved in this way, either within the volume using a level-set technique, or on a triangular mesh surface. The results can be surface rendered by texturing a triangular mesh or volume rendered by ray-casting. This approach can lead to a computational savings since the texture will be generated for a subset (e.g., a determined surface) of the entire scan volume. For example, FIG. 3 shows a segment of a corpus callosum 301 (white matter structure in the mammalian brain connecting the left and right cerebral hemispheres) may be textured with a 1024×1024 texture map, wherein the LIC was computed for 1048576 points, wherein the white matter is approximately 10 slices thick, and would have needed 10 slices of 512×512 texture to be determined (2621440 points). In FIG. 3, a two dimensional FA image 302 serves as a reference for the surface of the corpus callsoum 301. Other images such as an $F_0$ may be used as a reference.

It should be appreciated that while FIG. 3 is illustrated in grey scale, that the diffusion tensor thereof may be rendered in color using the color values of the PDD modified by grey scale values of the LIC and FA values.

Additionally, the visualization allows a user to more clearly see the boundary between tissue classes, and see diffusion at the interface.

It is to be understood that the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture.

Figure 4:
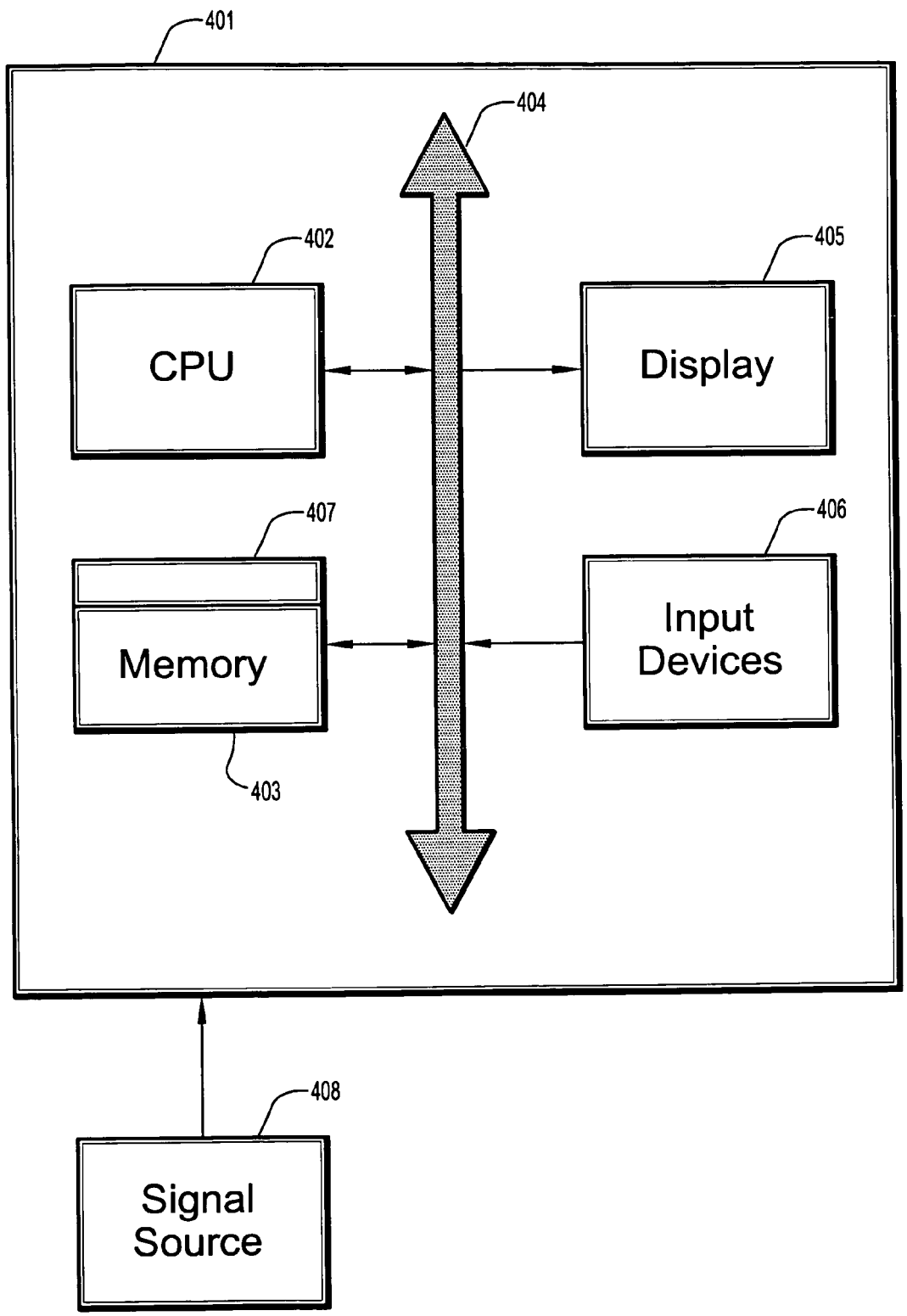
FIG. 4 is a diagram of a system according to an embodiment of the present disclosure.

Referring to FIG. 4, according to an embodiment of the present disclosure, a computer system 401 for implementing a method for diffusion tensor surface visualization can comprise, inter alia, a central processing unit (CPU) 402, a memory 403 and an input/output (I/O) interface 404. The computer system 401 is generally coupled through the I/O interface 404 to a display 405 and various input devices 406 such as a mouse and keyboard. The support circuits can include circuits such as cache, power supplies, clock circuits, and a communications bus. The memory 403 can include random access memory (RAM), read only memory (ROM), disk drive, tape drive, etc., or a combination thereof. The present invention can be implemented as a routine 407 that is stored in memory 403 and executed by the CPU 402 to process the signal from the signal source 408. As such, the computer system 401 is a general-purpose computer system that becomes a specific purpose computer system when executing the routine 407 of the present invention.

The computer platform 401 also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures may be implemented in software, the actual connections between the system components (or the process steps) may differ depending upon the manner in which the present invention is programmed. Given the teachings of the present disclosure provided herein, one of ordinary skill in the related art will be able to contemplate these and similar implementations or configurations.

Having described embodiments for a system and method for diffusion tensor surface visualization, it is noted that modifications and variations can be made by persons skilled in the art in light of the above teachings. It is therefore to be understood that changes may be made in embodiments of the present disclosure that are within the scope and spirit thereof.

What is claimed is:

1. A computer implemented method for diffusion tensor visualization comprising:

receiving, by a computer, diffusion weighted image slice data;

segmenting, by the computer, a diffusion tensor field from the diffusion weighted image slice data;

determining, by the computer, a fractional anisotropy field and a principle diffusion direction field of the diffusion tensor field, wherein the diffusion tensor field is restricted to surface points of the image slice data;

determining, by the computer, a surface rendering from the principle diffusion direction field;

determining, by the computer, an oriented texture intensity encoding local vector field tangents in grey scale values for the surface points of the diffusion tensor field;

determining, by the computer, a surface color for each of the surface points encoding a combination of the local vector field tangents of the oriented texture intensity, a color determined from the principle diffusion direction field, and a grey scale value of fractional anisotropy field at the surface points; and rendering, by the computer, the surface points having the corresponding surface colors.

2. The computer implemented method of claim 1, wherein a streamline is determined through each point on the segmented surface and is not determined for points other than the surface points.

3. The computer implemented method of claim 1, wherein the principle diffusion direction field is encoded in a color scheme according to directions of the streamlines determined through each point on the segmented surface.

4. The computer implemented method of claim 1, wherein the oriented texture intensity is a line integral convolution intensity with correlated values between pixels on the same streamline and contrasting values for pixels not sharing the streamline.

5. The computer implemented method of claim 4, wherein the line integral convolution generates intensity values by convolving a noise texture with a curvilinear kernel aligned with a streamline through each point.

6. The computer implemented method of claim 5, wherein the line integral convolution is determined according to $$I(x_0) = \int_{s_0-L}^{s_0+L} T(\sigma(s))k(s_0-s)\,ds$$

where $I(x_0)$ is the intensity of a line integral convolution texture at a point $x_0$, k is a filter kernel of a width 2L, T is the noise texture, and $\sigma$ is the streamline through the point $x_0$, wherein the streamline $\sigma$ is determined by numerical integration given a discrete field of eigenvectors.

7. The computer implemented method of claim 1, wherein determining the surface color includes multiplying the oriented texture intensity, the color determined from the principle diffusion direction field, and the value of fractional anisotropy field at each surface point.

8. A non-transitory computer readable medium embodying a program of instructions executable by a processor to perform method steps for diffusion tensor visualization, the method steps comprising:

receiving diffusion weighted image slice data;

segmenting a diffusion tensor field from the diffusion weighted image slice data;

determining a fractional anisotropy field and a principle diffusion direction field of the diffusion tensor field, wherein the diffusion tensor field is restricted to surface points of the image slice data;

determining a surface rendering from the principle diffusion direction field;

determining a streamline through each surface point of the surface rendering according to the principle diffusion direction field;

determining an oriented texture intensity encoding local vector field tangents in grey scale values for the surface points of the diffusion tensor field;

determining a surface color for each of the surface points encoding a combination of the local vector field tangents of the oriented texture intensity, a color determined from the principle diffusion direction field, and a grey scale value of fractional anisotropy field at the surface points; and rendering the surface points having the corresponding surface colors.

9. The method of claim 8, wherein the streamline is not determined for points other than the surface points.

10. The method of claim 8, wherein the principle diffusion direction field is encoded in a color scheme according to a direction of the streamline.

11. The computer implemented method of claim 8, wherein the oriented texture intensity is a line integral convolution intensity with correlated values between pixels on the same streamline and contrasting values for pixels not sharing the streamline.

12. The computer implemented method of claim 11, wherein the line integral convolution generates intensity values by convolving a noise texture with a curvilinear kernel aligned with the streamline through each point.

13. The computer implemented method of claim 12, wherein the line integral convolution is determined according to $$I(x_0) = \int_{s_0-L}^{s_0+L} T(\sigma(s))k(s_0 - s)ds$$

where $I(x_0)$ is the intensity of a line integral convolution texture at a point $x_0$, k is a filter kernel of a width 2L, T is the noise texture, and $\sigma$ is the streamline through the point $x_0$, wherein the streamline $\sigma$ is determined by numerical integration given a discrete field of eigenvectors.

14. The computer implemented method of claim 8, wherein determining the surface color includes multiplying the oriented texture intensity, the color determined from the principle diffusion direction field, and the value of fractional anisotropy field at each surface point.

* * * * *